(12) United States Patent
Shyu et al.

(10) Patent No.: US 7,934,173 B2
(45) Date of Patent: Apr. 26, 2011

(54) REVERSE DUMMY INSERTION ALGORITHM

(75) Inventors: Jiing-Shin Shyu, Hsin-Chu (TW); Tseng Chin Lo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 305 days.

(21) Appl. No.: 12/013,999

(22) Filed: Jan. 14, 2008

(65) Prior Publication Data

US 2009/0181314 A1 Jul. 16, 2009

(51) Int. Cl.
*G06F 17/50* (2006.01)
*G03F 1/14* (2006.01)

(52) U.S. Cl. .............................................. 716/19; 430/5
(58) Field of Classification Search .............. 716/50, 716/118, 119, 122, 132; 430/5
See application file for complete search history.

(56) References Cited

U.S. PATENT DOCUMENTS

| | | | | |
|---|---|---|---|---|
| 5,790,417 A | * | 8/1998 | Chao et al. | 716/21 |
| 5,798,298 A | * | 8/1998 | Yang et al. | 438/622 |
| 5,926,733 A | * | 7/1999 | Heo | 438/622 |
| 6,103,626 A | * | 8/2000 | Kim | 438/691 |
| 6,603,162 B1 | * | 8/2003 | Uchiyama et al. | 257/296 |
| 7,007,265 B2 | * | 2/2006 | Mori | 430/5 |
| 7,235,424 B2 | | 6/2007 | Chen et al. | |
| 7,458,053 B2 | * | 11/2008 | Ruderer et al. | 716/10 |

FOREIGN PATENT DOCUMENTS

JP 2000-338646 12/2000

* cited by examiner

*Primary Examiner* — Sun J Lin
(74) *Attorney, Agent, or Firm* — Slater & Matsil, L.L.P.

(57) ABSTRACT

A method of inserting dummy patterns includes providing a window area comprising a main pattern. The main pattern includes first patterns of a first type of features, and second patterns of a second type of features. The first and the second types are different types. The method further includes globally inserting first dummy patterns throughout the window area, wherein the first dummy patterns are dummy patterns of the first type of features; enlarging the main pattern to generate an enlarged main pattern, wherein the enlarged main pattern occupies an enlarged region of the window area; removing the portion of the first dummy patterns in the enlarged region from the first dummy patterns to generate first inversed dummy patterns; and combining the first patterns in the main pattern with the first inversed dummy patterns to generate first mask patterns for the first type of features.

18 Claims, 12 Drawing Sheets

REVERSE DUMMY INSERTION ALGORITHM

TECHNICAL FIELD

This invention relates generally to integrated circuit manufacturing processes, and more particularly to dummy patterns, and even more particularly to algorithms for inserting dummy patterns.

BACKGROUND

The pattern effect to the integrated circuit manufacturing processes has been well known as micro-loading effect, which occurs due to differences in pattern densities in a wafer. The micro-loading effect pertains to a phenomenon occurring upon simultaneously exposing, etching and/or polishing a pattern of a higher density and a pattern of a lower density. Due to a difference in exposure/etching/polishing rate of a film from one location to another, the amount of reaction produced by the exposure/etching/polishing becomes locally dense or sparse, and hence causes a non-uniformity in etching/polish rates or pattern dimension after exposure. Big variations in effective pattern densities may result in significant and undesirable effects such as pattern dimension deviation and thickness variation.

To counteract this effect, a layout design step known as dummy insertion was developed, during which the circuit layout is modified and dummy patterns are inserted to locations with low pattern density. The insertion of dummy patterns helps achieve uniform effective pattern density across the wafer, therefore avoiding problems.

Typically, after a design house finishes a design of an integrated circuit, a graphic data system (GDS) file, which is a binary file including the layout of the integrated circuit, is generated. A program may be used to insert dummy patterns. After the dummy patterns are inserted, design houses may provide (tape-out) the GDS files to a foundry. Masks are then generated by the foundry or mask vendors.

Dummy patterns may be divided into OD dummy patterns, poly dummy patterns, metal dummy patterns, etc. OD dummy patterns are dummy active region patterns, poly dummy patterns include patterns of polysilicon gates for forming gates of transistors, and metal dummy patterns are patterns of metal features in metallization layers. OD dummy patterns and poly dummy patterns are often operated together. Using OD dummy patterns as an example, typically, to insert dummy patterns, the dummy insertion program needs to find out the main patterns of ODs and polys, and then looks for areas that do not contain ODs and polys to insert OD dummy patterns. FIG. 1 illustrates three types of dummy cells used for ODs and polys. Dummy cell 1 includes dummy poly region 10 and dummy OD ring 12 encircling dummy poly region 10. Dummy cell 2 includes dummy poly region 14 and dummy OD ring 16 encircling dummy poly region 14. Dummy cell 2 is significantly smaller than cell 1. Polysilicon formation is more sensitive to the pattern density, and thus needs more uniformly distributed dummy poly patterns. Accordingly, cell 3 is a dummy poly pattern, which is not dispatched together with a dummy OD pattern.

In a conventional (forward) dummy insertion process, the dummy insertion program looks into the GDS file, and inserts dummy pattern cells 1 wherever they can be inserted without violating design rules. The dummy insertion program then looks for regions that are not big enough for dummy pattern cell 1, but are big enough for dummy pattern cell 2, and insert dummy pattern cells 2. For the insertion of dummy polysilicon, the dummy insertion program may need to find regions that are not big enough for dummy pattern cells 1 and 2, but are big enough to insert dummy poly pattern cell 3.

FIG. 2 illustrates an OD mask pattern including inserted dummy OD patterns, wherein only the patterns of active regions and dummy active regions, are shown. Region 20 is a device region, and is referred to as a main pattern. Squares 22 are dummy patterns of cell 1, and squares 24 are dummy pattern cells 2. If a poly mask instead of an OD mask is shown, dummy pattern cells 3 may also be found.

The conventional dummy insertion scheme suffers from drawbacks. First, inserting dummy patterns is typically a long process that may take several hours or even days. Therefore, foundries often provide the program dummy insertions to the design houses, and allow design houses to insert dummy patterns by themselves. The proprietary information of how dummy patterns are inserted is thus exposed. Second, after inserting dummy patterns, the sizes of GDS files are increased drastically, often from about one Gbits or less to tens of Gbits. This not only consumes huge storage, it is also much harder to find a computer to process such big files. Thirdly, as is shown in FIG. 2, the dummy patterns are not uniformly inserted. This causes adverse effects to the critical dimension uniformity control and chemical mechanical polish uniformity control. New dummy insertion methods for solving the above-discussed problems are thus needed.

SUMMARY OF THE INVENTION

In accordance with one aspect of the present invention, a method of inserting dummy patterns includes providing a window area comprising a main pattern. The main pattern includes first patterns of a first type of features, and second patterns of a second type of features. The first and the second types are different types. The method further includes globally inserting first dummy patterns throughout the window area, wherein the first dummy patterns are dummy patterns of the first type of features; enlarging the main pattern to generate an enlarged main pattern, wherein the enlarged main pattern occupies an enlarged region of the window area; removing the portion of the first dummy patterns in the enlarged region from the first dummy patterns to generate first inversed dummy patterns; and combining the first patterns in the main pattern with the first inversed dummy patterns to generate first mask patterns for the first type of features.

In accordance with another aspect of the present invention, a method of inserting dummy patterns includes providing a window area comprising a main pattern of a type of features selected from the group consisting essentially of gate electrodes and active regions; inserting dummy patterns throughout the window area; enlarging the main pattern to generate an enlarged main pattern, wherein the enlarged main pattern occupies an enlarged region of the window area; removing a portion of the dummy patterns in the enlarged region from dummy patterns to generate inversed dummy patterns; and combining the main pattern with the inversed dummy patterns to generate mask patterns, wherein the main pattern is placed in a middle portion of the enlarged region.

In accordance with yet another aspect of the present invention, a mask for manufacturing integrated circuits includes a window area comprising a main pattern; and dummy patterns in a region outside a region occupied by the main pattern. The dummy patterns throughout the window area have substantially a unit pitch.

The advantageous features of the present invention include reduced dummy insertion time and reduced increment in the layout file size.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for inserting dummy patterns into layouts of integrated circuit is provided. The intermediate stages of performing the method are provided. The variations of the preferred embodiments are then discussed. Throughout the various views and illustrative embodiments of the present invention, like reference numbers are used to designate like elements.

Typically, the layouts of integrated circuits are stored in graphic data system (GDS) format, and hence the layout file(s) of integrated circuits are referred to as a GDS file(s) throughout the description. It is realized that the layouts may be saved in different formats. However, the concept of the present invention still applies.

In the preferred embodiment, GDS files need to go through Boolean operations and optical proximity corrections to modify the layouts. Masks are then made from the modified GDS file. Preferably, in the Boolean operations, dummy patterns are inserted. In addition, layout modifications, such as modifying the sizes of contacts, adding patterns for lightly doped source/drain (LDD) regions, and the like, are performed. Optical proximity correction steps are then performed to compensate for the optical proximity effects. In subsequent paragraphs, a method for inserting dummy active regions is discussed, wherein active regions are also referred to as ODs.

Figure 1:
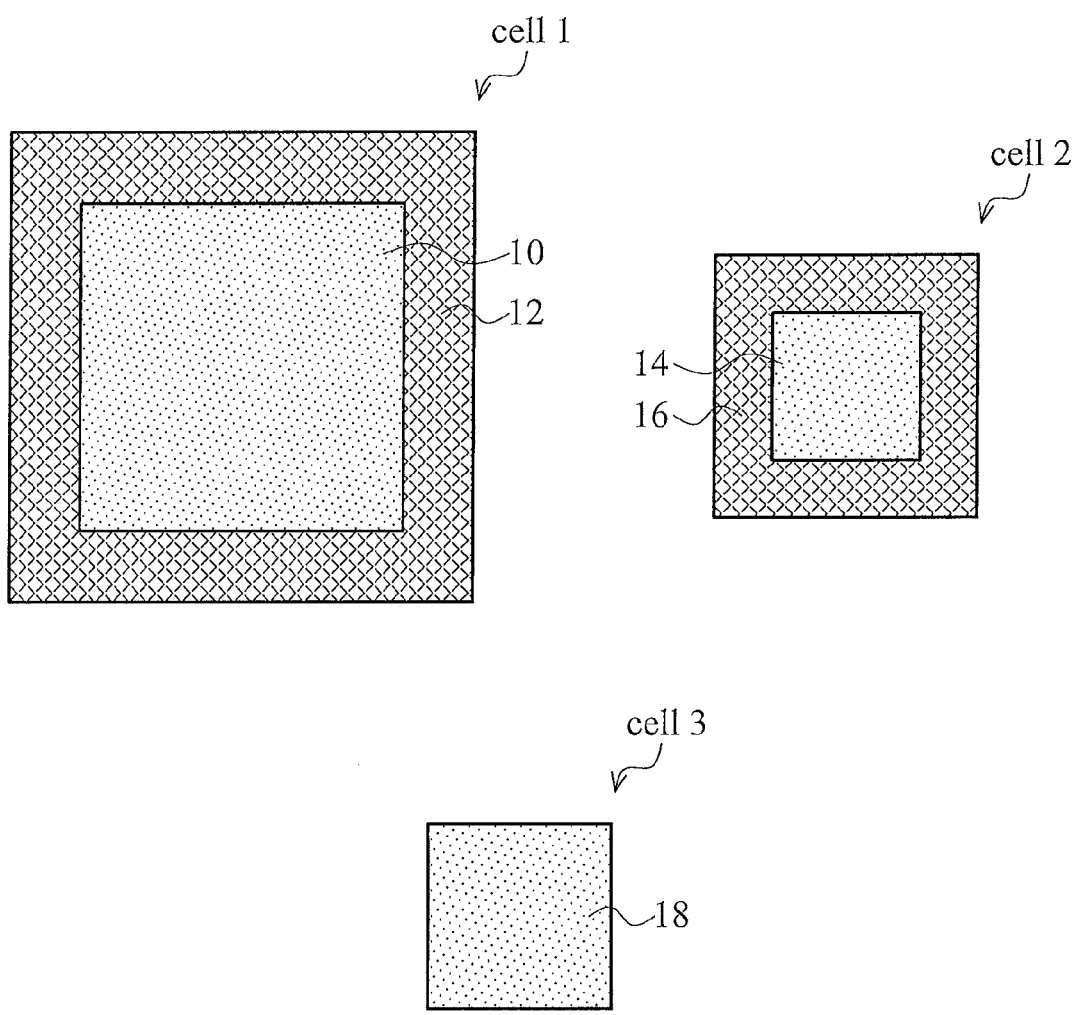
FIG. 1 illustrates conventional dummy cells including dummy active regions and dummy polys.
Figure 2:
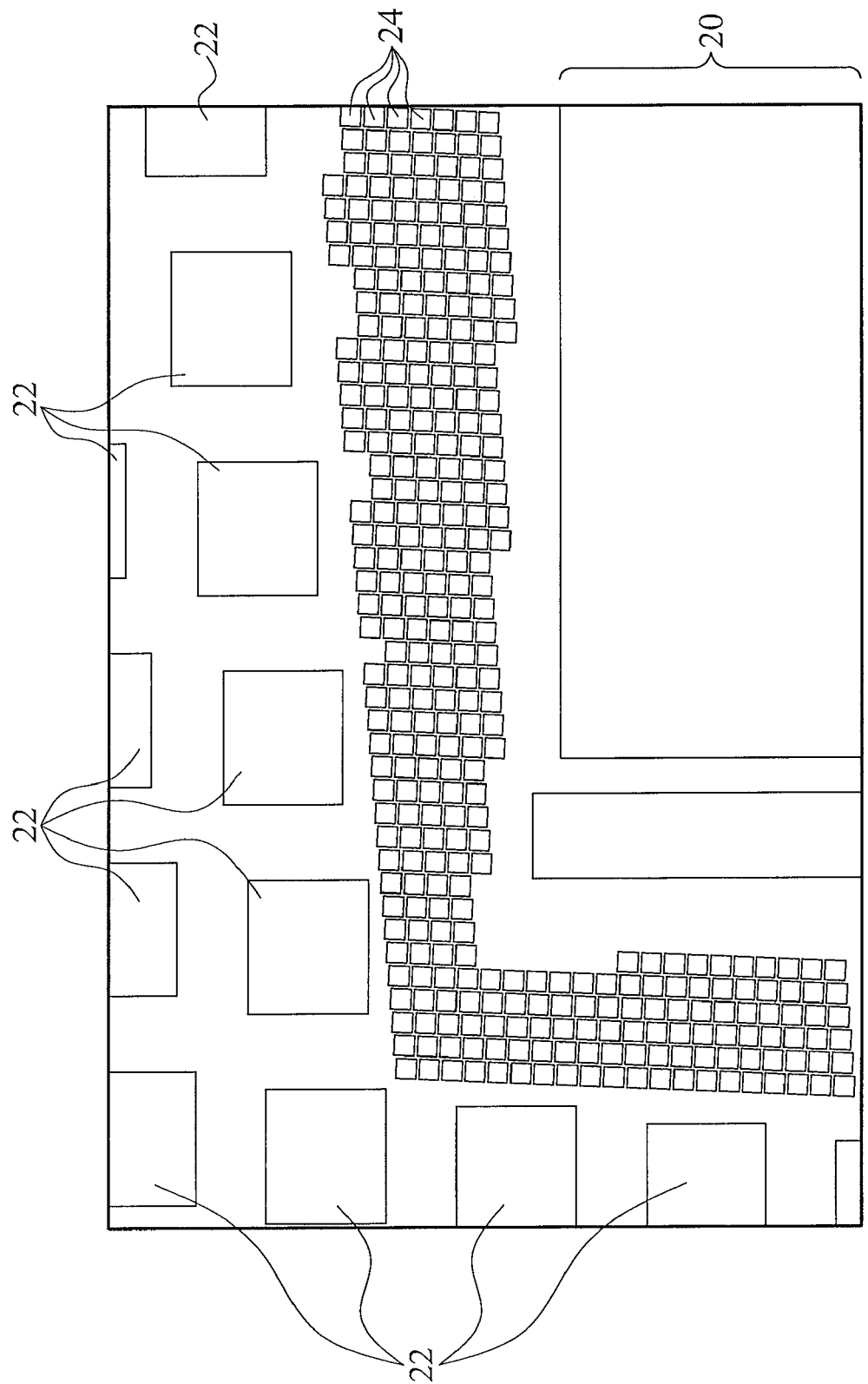
FIG. 2 illustrates inserted dummy active regions in a conventional active region (OD) mask.
Figure 3:
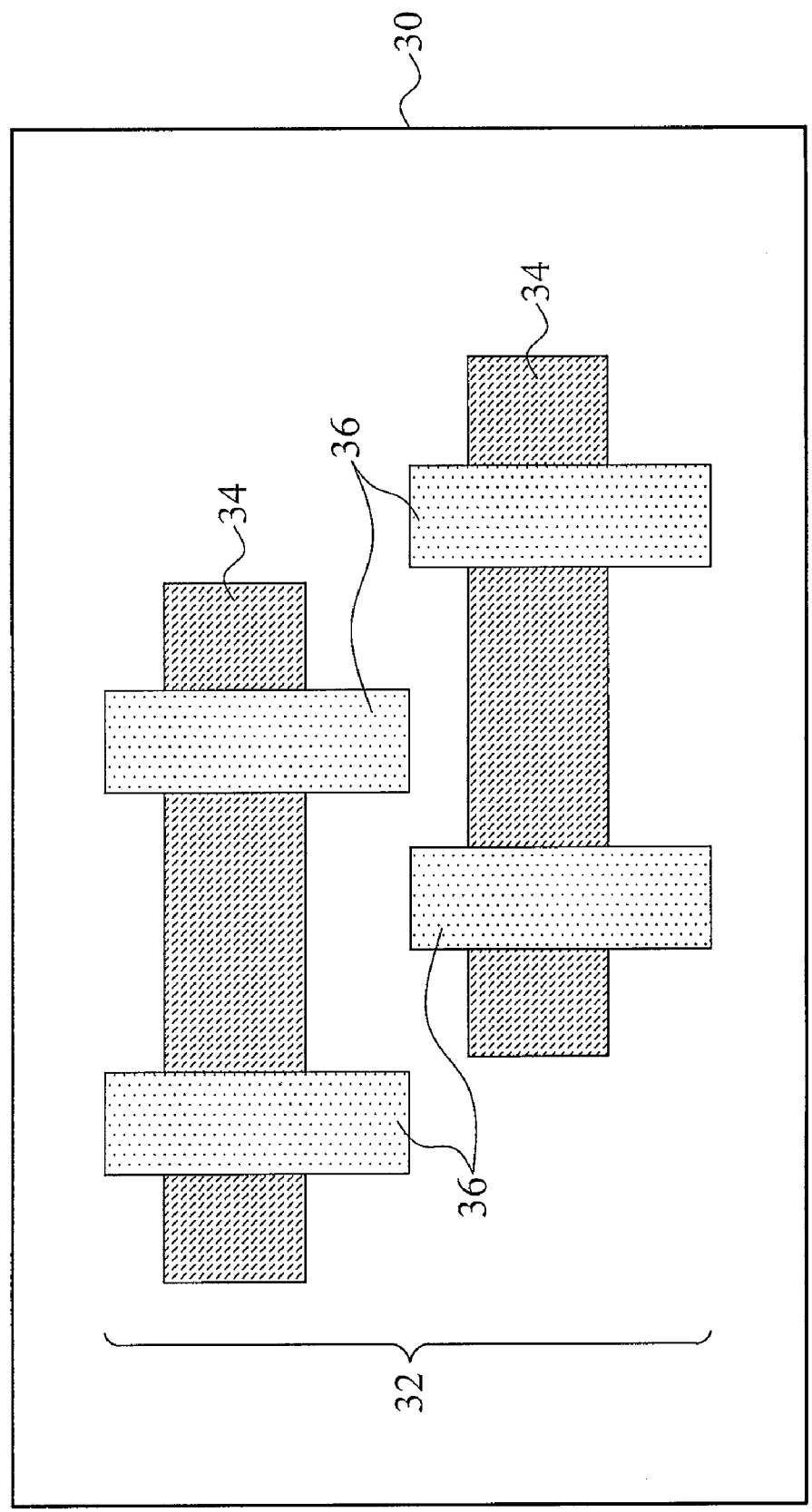
FIGS. 3 through 8 illustrate intermediate stages in a reverse dummy insertion process.

FIG. 3 illustrates window area 30 of a circuit layout, wherein window area 30 is where integrated circuits (including dummy patterns) are to be formed. Main pattern 32, which includes OD patterns 34 and polysilicon patterns 36, is provided in window area 30. One skilled in the art will realize that although the terms "polysilicon" or "poly" are used, patterns 36 may actually be the patterns of gate electrodes of transistors, and other conductive patterns formed simultaneously with the gate electrodes such as resistors. The materials of patterns 36 may include metals, metal silicides, metal nitrides, polysilicon, combinations thereof, and multi-layers thereof.

Figure 4:
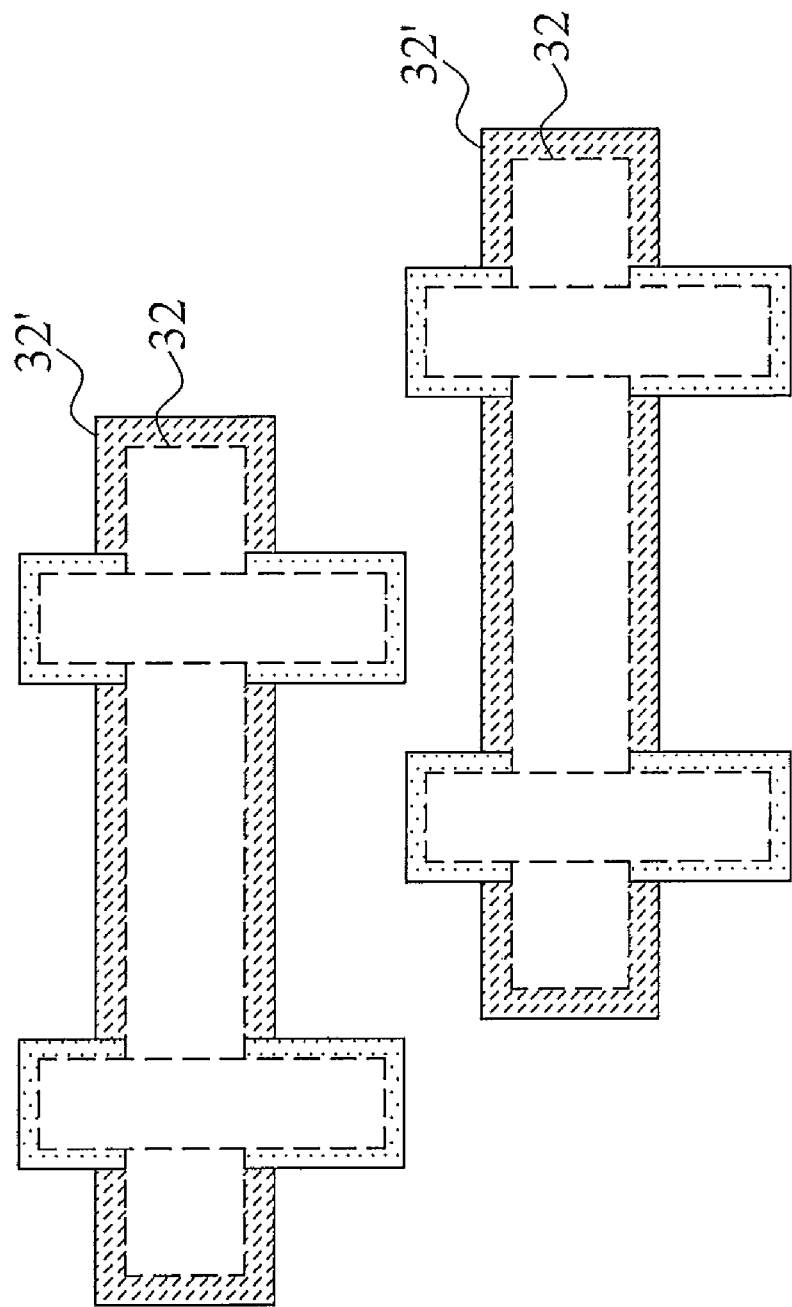

A sizing operation is then performed to main pattern 32. FIG. 4 illustrates an enlarged version 32' of the main pattern 32. As a comparison, main pattern 32 is also illustrated. In the preferred embodiment, the width and length of main pattern 32 are both increased by a certain factor, such as about ten percent to about 500 percent. In alternative embodiments, the width and length of main pattern 32 are increased on each side by a distance of 1 time to 30 times the "minimum width" allowed by design rules. Accordingly, the dimensions of OD patterns 34 and polysilicon patterns 36 in main pattern 32 are also increased by about ten percent.

Figure 5:
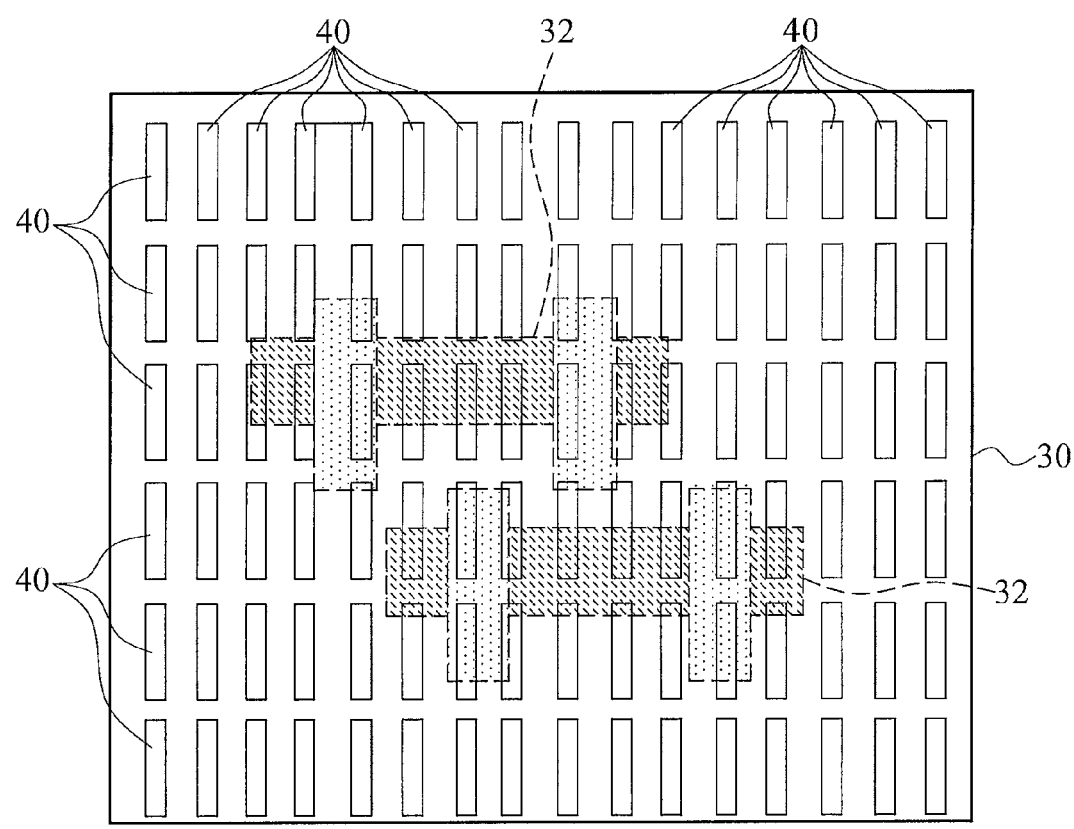

In FIG. 5, dummy OD patterns 40 are globally inserted throughout window area 30. In the preferred embodiment, the GDS file(s) has a hierarchical structure, and dummy OD patterns 40 are added as a separate layer of the GDS file than that of OD patterns 34 and polysilicon patterns 36. Accordingly, dummy OD patterns 40 include portions overlapping main patterns 32, and portions not overlapping main pattern 32. In the preferred embodiment, dummy OD patterns 40 are parallel strips, and are arranged as an array. Adding dummy OD patterns 40 as a separate layer significantly reduces the effort for the dummy insertion. The increase in the file size of the resulting GDS files is also substantially unnoticeable.

Figure 6:
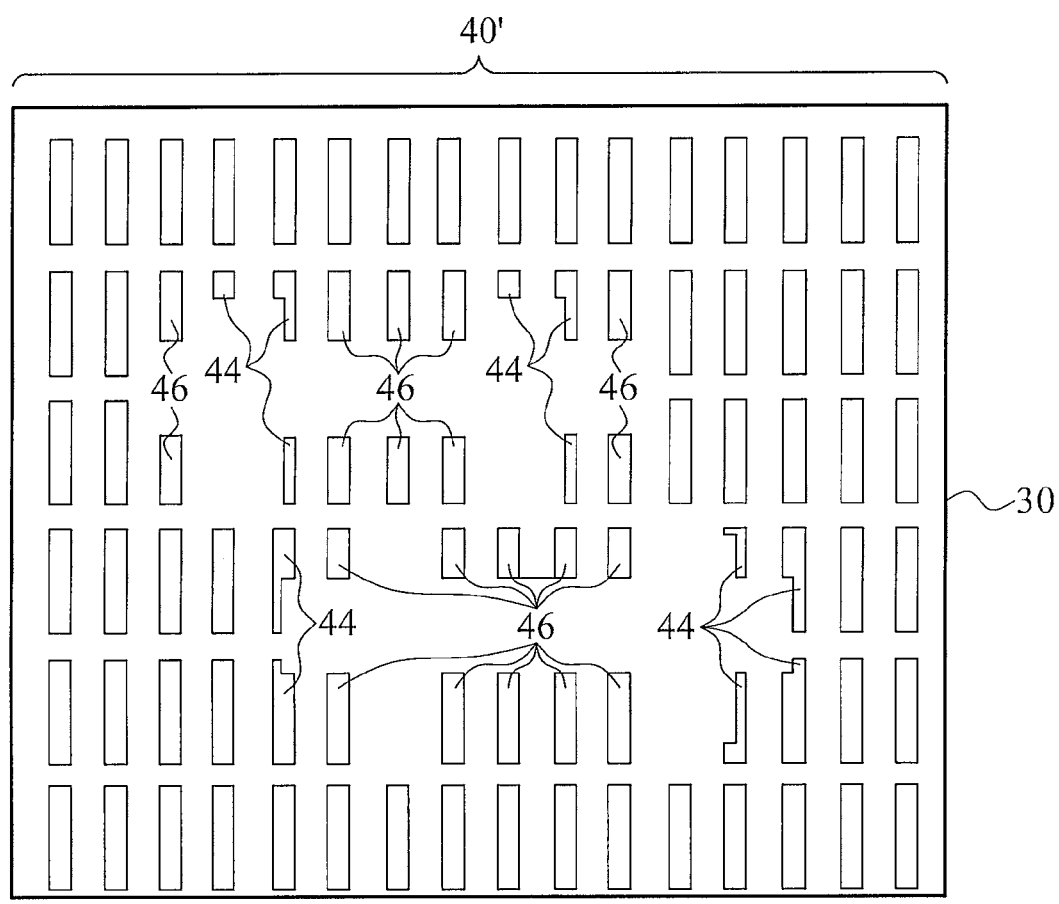

In FIG. 6, dummy OD patterns 40 include portions overlapping main pattern 32', which portions are hence located inside regions defined by the enlarged main pattern 32'. These portions of the dummy OD patterns 40 are subtracted from the globally inserted dummy OD patterns 40. Since the enlarged main pattern 32' includes the main patterns of both ODs and polysilicon, the remaining portions of dummy patterns 40 do not include any dummy patterns overlapping OD regions 34 and polysilicon regions 36. The remaining portion of dummy patterns 40 is roughly an inversed pattern of the enlarged main pattern 32', and is referred to as dummy patterns 40'.

Figure 7A:
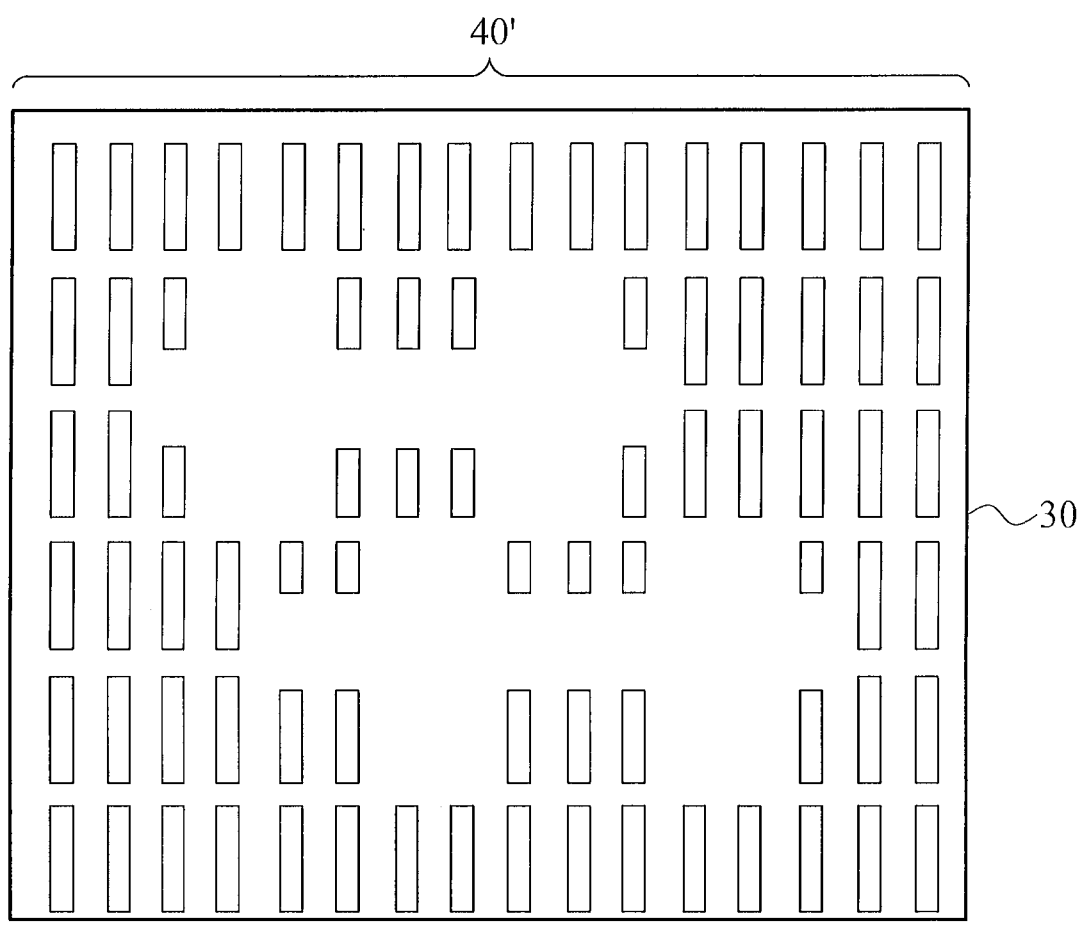

Dummy patterns 40' may include dummy patterns 44 that are either very small, or have irregular shapes. Dummy patterns 44 unnecessarily cause an increase in the complexity of dummy patterns, while have little contribution to the reduction of pattern loading effect. A smoothing operation is thus performed to remove small dummy patterns 44 and to shape irregular dummy patterns 44. The smoothing operation may be performed by a miniature program. The resulting patterns after the smoothing operation is shown in FIG. 7A.

Figure 7B:
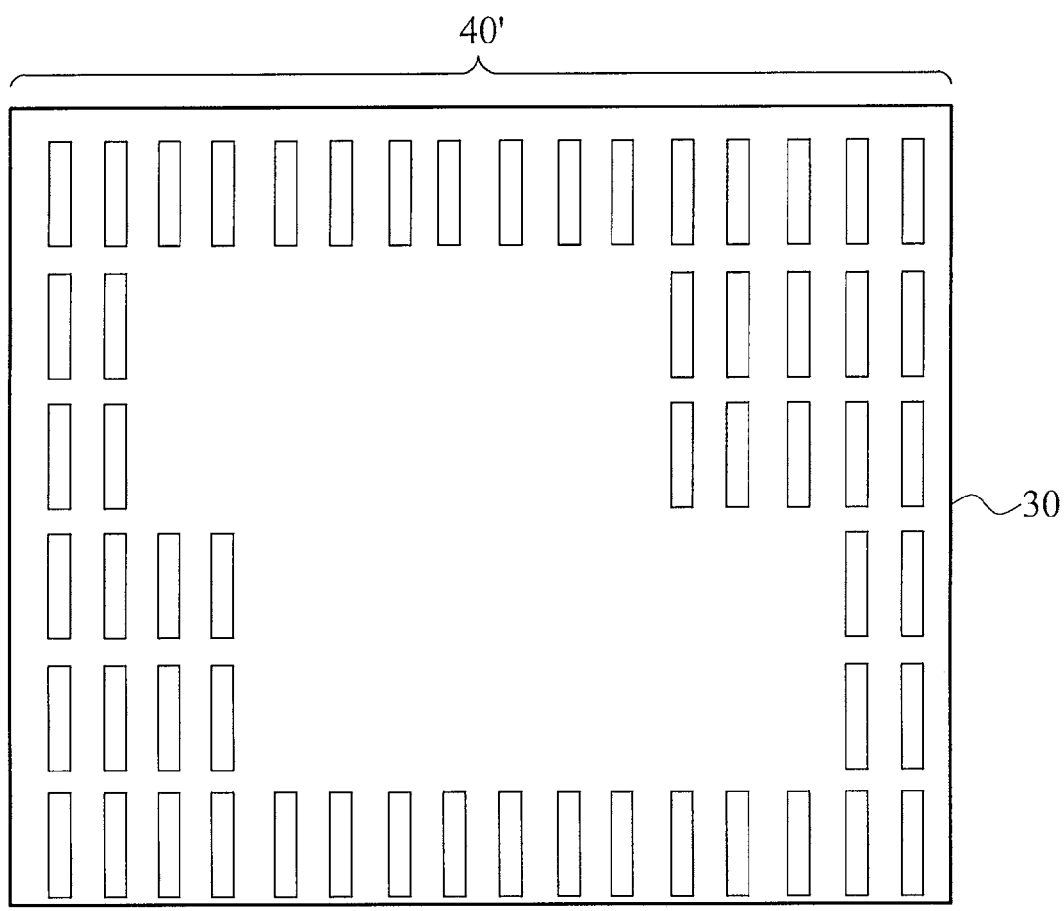

FIG. 7B illustrates an alternative embodiment, in which not only dummy patterns 44, but also any dummy patterns 46 (refer to FIG. 6) that are reduced in size because of the removal of dummy patterns, are removed from enlarged main pattern 32'. In other words, any inserted dummy patterns 40, as long as any portion is inside the enlarged main pattern 32', will be removed. In this embodiment, the calculation does not have to go through the step shown in FIG. 6. Instead, the pattern shown in FIG. 7B may be directly calculated from the pattern shown in FIG. 5. This embodiment may further reduce the time used by the dummy insertion process.

Figure 8:
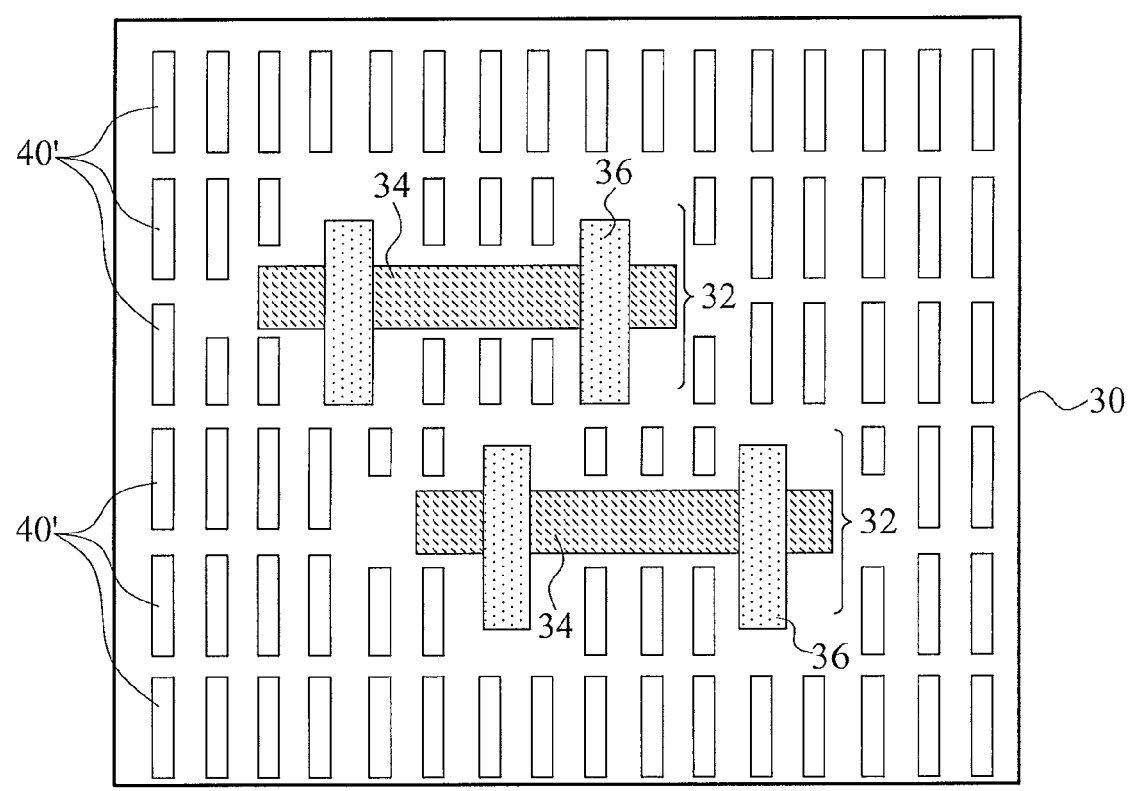

Referring to FIG. 8, main pattern 32 is combined with dummy patterns 40' to form a new pattern. Since dummy patterns 40' are formed by removing enlarged dummy patterns 32', the vacancy in dummy patterns 40' is bigger than main pattern 32. By placing main pattern 32 in the center of the vacancy, main pattern 32 may have an even spacing from neighboring dummy patterns 40' in all directions. Since the GDS file has a layered structure, the OD patterns 34 in main pattern 32 may be extracted easily, and combined with the dummy patterns 40' to form the patterns (referred to as OD mask patterns hereinafter) that will appear on the OD mask. Similarly, the polysilicon patterns 36 in main pattern 32 may be extracted, and combined with dummy patterns 40' to form the patterns (referred to as poly mask patterns hereinafter) for the mask of polysilicon.

After the process steps discussed in the preceding paragraphs, additional main logic operations, which may include layout modifications, such as modifying the sizes of contacts, adding patterns for lightly doped source/drain (LDD) regions, and the like, are performed to the GDS file. An optical proximity correction step is then performed to compensate for the optical proximity effects. The mask OD patterns and mask poly patterns are then taped out, and transferred to respective masks.

Figure 9A:
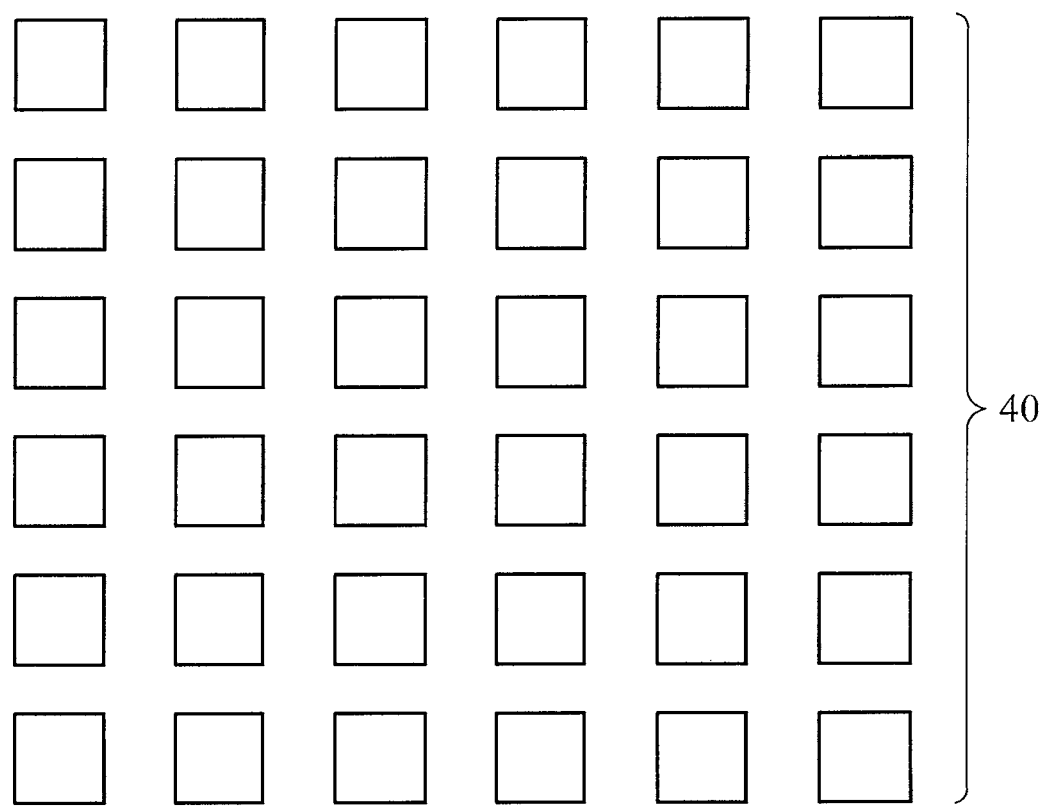
FIGS. 9A through 9C illustrate examples of different dummy patterns.
Figure 9B:
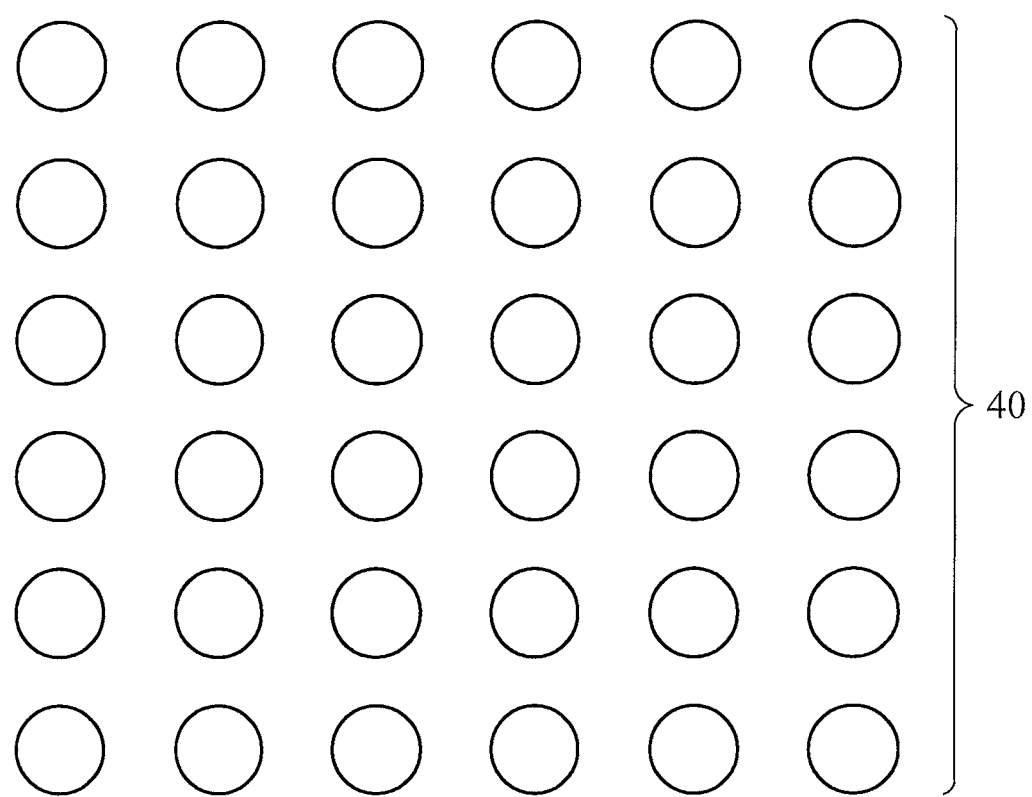
Figure 9C:
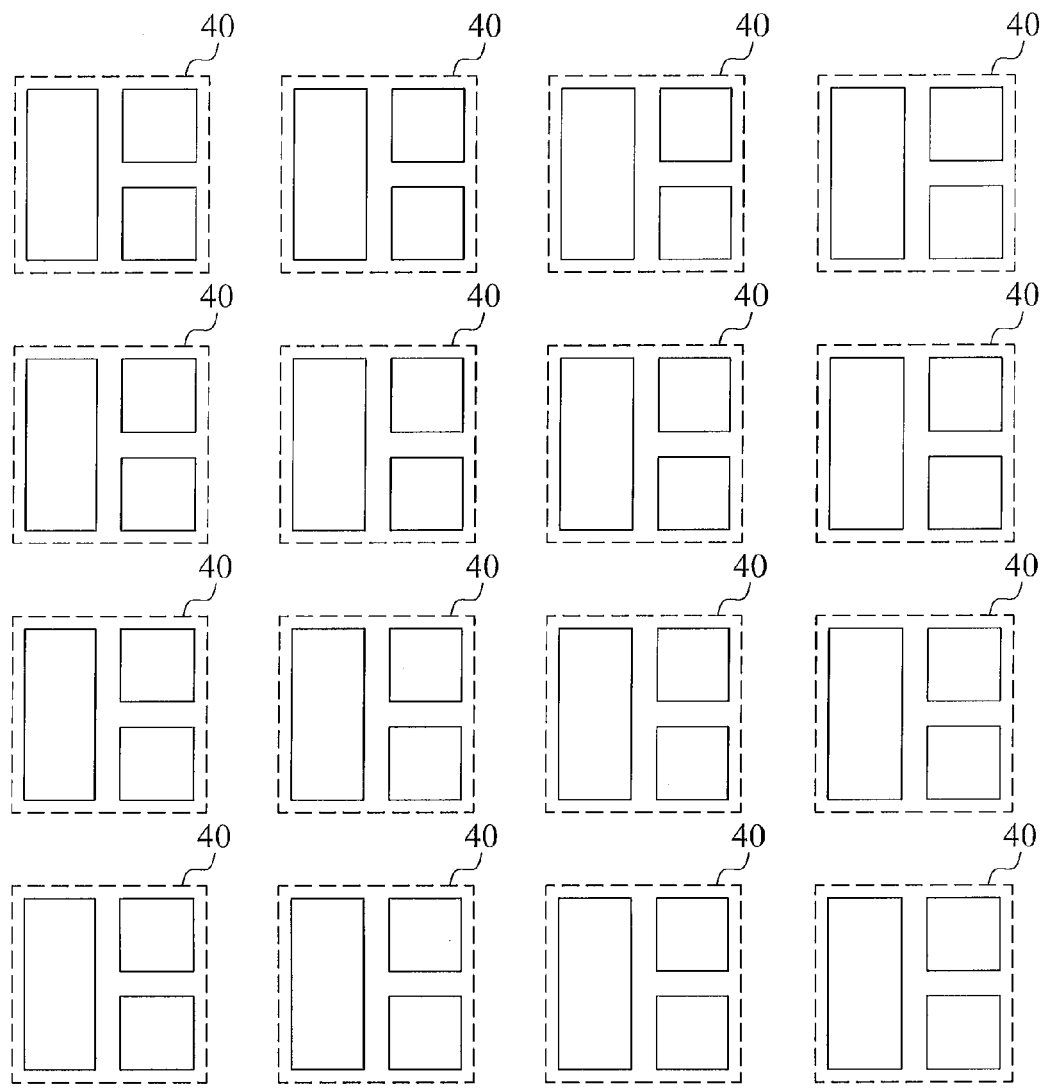

In the previously discussed embodiment, since poly mask patterns and OD mask patterns both include the patterns of dummy patterns 40', the patterns of dummy polys and the patterns of dummy ODs are the same. However, in practical cases, OD patterns and poly patterns are often different, for example, ODs are often formed of rectangular-shaped blocks, while polysilicon patterns are often formed of long and narrow strips. In order to achieve more uniform pattern density, the patterns of dummy ODs and dummy poly patterns preferably imitate the patterns of ODs and polys, respectively. In this case, the insertion of dummy OD patterns and the insertion of dummy poly patterns each needs to go through the processes in FIGS. 5 through 8, and the globally inserted dummy OD patterns (refer to FIG. 5) and the globally inserted dummy poly patterns are different in shapes, densities, sizes, and/or the like. In an exemplary embodiment for inserting dummy OD patterns, the globally inserted dummy OD patterns (refer to dummy patterns 40 in FIG. 5) include block type dummy regions, similar to what are shown in FIG. 9A. On the other hand, for inserting dummy poly patterns, the globally inserted dummy patterns 40 are stripes, as shown in FIG. 5. In yet other embodiments, other shapes, such as circles, hexagons, and the like, may be used. FIG. 9B illustrates dummy patterns 40 formed of circles. In yet other embodiments, as shown in FIG. 9C, the globally inserted dummy patterns 40 include a plurality of identical dummy groups. Although the number and shape of dummy patterns in the dummy groups may vary, throughout the window area, dummy pattern groups 40 are identical to each other and have a unit pitch.

In the embodiment discussed in the preceding paragraphs, main pattern 32 includes both OD patterns 34 and poly patterns 36. In alternative embodiments, for inserting dummy OD patterns, the main pattern 32 only includes OD patterns 34. Similarly, for inserting dummy poly patterns, the main pattern 32 only includes poly patterns 36. The respective dummy insertion processes are similar to what have been discussed in FIGS. 5 through 8, except that main pattern 32 only includes one of the OD patterns 34 and poly patterns 36.

Besides forming mask patterns for polys and ODs, the concept of the present invention can also be applied on the formation of metal lines, metal pads in metallization layers, metal vias between the metallization layers, and/or contact plugs in inter-layer dielectric (ILD). In these cases, the main patterns may be the patterns of the desirable metal lines, metal vias or contact plugs, or combinations thereof. In each of the cases, the shape, size, and pattern density of the inserted dummy patterns preferably simulate the shape, size and pattern density of the respective real (non-dummy) patterns. In addition, the main patterns 32 may include other types of the features in the integrated circuit, for example, contact plugs, vias, and the like. Accordingly, the resulting inserted dummy features are excluded out of the enlarged regions of the respective contact plugs, vias, and the like.

It is realized that the dummy patterns inserted by the embodiments of the present invention have a unit pitch throughout the window area. As is shown in FIG. 8, the pitch between the inserted dummy patterns throughout the window area 30 (except border dummy patterns neighboring main patterns) is the same, and thus the dummy patterns in the resulting mask patterns are referred to as unit-pitch dummy patterns. One skilled in the art will realize that the pitches may be different depending on the direction the pitches are measured. However, for a given direction, the respective pitches of the dummy patterns in masks are the same. Further, the shapes and sizes of substantially all dummy patterns, except border dummy patterns neighboring main patterns, are substantially the same. In the case shown in FIG. 9C, the dummy pattern groups 40 have a unit pitch.

The embodiments of the present invention are referred to as reversed dummy insertion process due to the fact that instead of finding pattern-sparse regions and inserting dummy patterns into the pattern-sparse regions, the dummy patterns are inserted throughout the window area, followed by removing undesirable dummy patterns from the regions occupied by main patterns. The embodiments of the present invention have several advantageous features. First, the increase in the file size of the GDS files is minimal. Experiments have revealed that the GDS file sizes are only increased less than about one percent after the dummy patterns are inserted. As a comparison, conventional dummy pattern insertion causes the GDS file sizes to increase ten times typically. Second, the dummy pattern insertion is significantly faster, typically taking less than one day, while conventional dummy insertion processes typically take up to several days. Thirdly, due to the improvement in the insertion efficiency, foundries may perform dummy insertion processes by themselves, without the need to require design houses to perform the dummy insertion processes. This reduces the tape-out effort of design houses. In addition, the proprietary information related to the dummy insertion processes is better protected.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of inserting dummy patterns, the method comprising:

providing a window area comprising a main pattern, wherein the main pattern comprises first patterns of a first type of features, and second patterns of a second type of features, and wherein the first and the second types are different types;

globally inserting first dummy patterns throughout the window area, wherein the first dummy patterns are dummy patterns of the first type of features;

enlarging the main pattern to generate an enlarged main pattern, wherein the enlarged main pattern occupies an enlarged region of the window area;

removing an entire portion of the first dummy patterns in the enlarged region from the first dummy patterns to generate first inversed dummy patterns;

combining the first patterns in the main pattern with the first inversed dummy patterns to generate first mask patterns for the first type of features, wherein at least one of the steps of globally inserting the first dummy patterns, enlarging the main pattern, removing the entire portion of the first dummy patterns, and combining the first patterns is performed by a design tool; and taping-out a graphic data system (GDS) file comprising the first mask patterns.

2. The method of claim 1, wherein the first type of features comprise active regions, and wherein the second type of features comprise gate electrodes.

3. The method of claim 1, wherein the first type of features comprise gate electrodes, and wherein the second type of features comprise active regions.

4. The method of claim 1 further comprising:

globally inserting second dummy patterns throughout the window area;

removing an entire portion of the second dummy patterns in the enlarged region from the second dummy patterns to generate second inversed dummy patterns; and combining the second patterns in the main pattern with the second inversed dummy patterns to generate second mask patterns for the second type of features, wherein the second patterns in the main pattern are placed in a middle portion of the enlarged region.

5. The method of claim 4, wherein the second dummy patterns are different from the first dummy patterns.

6. The method of claim 1, after generating the first mask patterns, further comprising:

performing Boolean operations to the first mask patterns;

performing optical proximity corrections to the first mask patterns; and forming a mask comprising the first mask patterns.

7. The method of claim 1, wherein the first dummy patterns have a unit pitch throughout the window area.

8. The method of claim 1, wherein the first dummy patterns comprise repeated identical dummy pattern groups, and wherein the dummy pattern groups have a unit pitch throughout the window area.

9. The method of claim 1, wherein a width of the enlarged main pattern is greater than a width of the main pattern by between about 10 percent and about 500 percent.

10. The method of claim 1, after removing the portion of the first dummy patterns in the enlarged region, further comprising performing a smoothing step.

11. The method of claim 1, wherein the window area, the first dummy patterns, and the main pattern are defined in graphic data system (GDS) files, and wherein the first dummy patterns are defined in a layer in the GDS files different from a layer of the main pattern.

12. A method of inserting dummy patterns, the method comprising:

providing a window area comprising a main pattern of a type of features selected from a group consisting essentially of gate electrodes and active regions;

inserting dummy patterns throughout the window area;

enlarging the main pattern to generate an enlarged main pattern, wherein the enlarged main pattern occupies an enlarged region of the window area;

removing an entire portion of the dummy patterns in the enlarged region from the dummy patterns to generate inversed dummy patterns;

combining the main pattern with the inversed dummy patterns to generate mask patterns, wherein the main pattern is placed in a middle portion of the enlarged region, wherein at least one of the steps of inserting the dummy patterns, enlarging the main pattern, removing the entire portion of the dummy patterns, and combining the main pattern is performed by a design tool; and taping-out a graphic data system (GDS) file comprising the mask patterns.

13. The method of claim 12, wherein the dummy patterns each has a rectangular shape.

14. The method of claim 12, wherein the dummy patterns have a unit pitch throughout the window area.

15. The method of claim 12, wherein the dummy patterns comprise repeated identical dummy pattern groups, and wherein the dummy pattern groups have a unit pitch throughout the window area.

16. The method of claim 12, wherein the window area, the dummy patterns, and the main pattern are defined in a graphic data system (GDS) format.

17. The method of claim 16, wherein the dummy patterns are defined in a separate layer different from the main pattern.

18. The method of claim 12, after generating the first mask patterns, further comprising:

performing main logic operations to the mask patterns;

performing optical proximity corrections to the mask patterns; and forming a mask comprising the mask patterns.

* * * * *